(12) United States Patent
Torii

(10) Patent No.: US 7,338,623 B2
(45) Date of Patent: Mar. 4, 2008

(54) ELECTRICALLY-CONDUCTIVE RESIN COMPOSITIONS AND MOLDINGS

(75) Inventor: Hideyasu Torii, Kawagoe (JP)

(73) Assignee: Regulus Co., Ltd., Kawagoe-shi (JP)

( * ) Notice: Subject to any disclaimer, the term of this patent is extended or adjusted under 35 U.S.C. 154(b) by 483 days.

(21) Appl. No.: 10/961,022

(22) Filed: Oct. 12, 2004

(65) Prior Publication Data
US 2006/0006368 A1    Jan. 12, 2006

(30) Foreign Application Priority Data
Jul. 9, 2004 (JP) .............................. 2004-203860

(51) Int. Cl.
| | | |
|---|---|---|
| H01B 1/12 | (2006.01) | |
| H01B 1/00 | (2006.01) | |
| C08G 63/08 | (2006.01) | |

(52) U.S. Cl. .................. 252/519.33; 528/354; 252/500
(58) Field of Classification Search ................ 252/500, 252/518.1, 519.33; 528/354
See application file for complete search history.

(56) References Cited

U.S. PATENT DOCUMENTS 5,863,466 A * 1/1999 Mor .......................... 252/500
6,621,684 B2 * 9/2003 Shimamoto et al. ........ 361/502

FOREIGN PATENT DOCUMENTS

| JP | 61-85460 | 5/1986 |
|---|---|---|
| JP | 2001-316593 | 11/2001 |
| JP | 2002-179898 | * 6/2002 |

* cited by examiner

*Primary Examiner*—Douglas McGinty
*Assistant Examiner*—Jaison Thomas
(74) *Attorney, Agent, or Firm*—Oblon, Spivak, McClelland, Maier & Neustadt, P.C.

(57) ABSTRACT

An electrically-conductive resin composition comprises (A) a thermoplastic resin and (B) an electrically-conductive polymer blended together. The electrically-conductive polymer is an electrically-conductive polyester doped with a dissociable inorganic salt. The doped polyester is at least one polyester selected from the group consisting of (a) polyesters each of which has a weight average molecular weight of from 50,000 to 500,000 and has been obtained by subjecting at least caprolactone as a monomer to ring-opening polymerization and (b) comb polyesters each of which has one or more polyester chains each having a weight average molecular weight of from 50,000 to 200,000 and has been obtained by subjecting a lactone to ring-opening polymerization in the presence of a trifunctional or higher functional, polyhydric alcohol as a polymerization initiator. Electrically-conductive resin moldings made of such electrically-conductive resin compositions are also disclosed.

8 Claims, No Drawings

ELECTRICALLY-CONDUCTIVE RESIN COMPOSITIONS AND MOLDINGS

BACKGROUND OF THE INVENTION a) Field of the Invention

This invention relates to electrically-conductive resin compositions excellent in antistatic properties, and also to electrically-conductive resin moldings or products obtained by molding or otherwise forming the electrically-conductive resin compositions. The expression "moldings or products" may hereinafter be collectively called "moldings". Likewise, the expression "molding or otherwise forming" may hereinafter be collectively called "molding".

b) Description of the Related Art

Various electronic parts, for example, ICs, capacitors, transistors and LSIs have conventionally been stored and shipped by sealing them in packages or containers called "electrically-conductive (antistatic) carrier tapes or carrier trays", as these electronic parts are susceptible to damage by a spark of charged static electricity. These packages or containers for such electronic parts are used by molding or otherwise forming them with an electrically-conductive resin composition or applying an electrically-conductive coating formulation to surfaces of packages or containers molded or otherwise formed with an electrically-insulating resin such that the packages or containers are provided with electrical conductivity to such an extent as preventing the charging of static electricity on them.

As an electrically-conductive material for the above-described electrically-conductive resin composition or electrically-conductive coating formulation, electrically-conductive carbon black is used most widely. However, carbon black is in a fine particulate form. It is, therefore, accompanied by a problem in that carbon black is prone to separation from the surfaces of packages or containers of electronic parts and the fine particles of the carbon black so separated may damage the electronic parts. Further, carbon black is available only in a black color, and therefore, involves another problem in that the packages or containers are inferior in external attractiveness. As electrically-conductive materials capable of replacing electrically-conductive carbon black, a variety of electrically-conductive high molecular materials have been proposed. However, these electrically-conductive high molecular materials are costly and are required to be used in large proportions. They are, hence, inferior in practical utility.

As electrically-conductive materials capable of substituting for such electrically-conductive high molecular materials, dissociable inorganic salts such as lithium perchlorate have also been proposed, for example. However, these dissociable inorganic salts have low compatibility with thermoplastic resins which make up packages or containers or with coating-forming materials in electrically-conductive coating formulations, so that it is difficult to evenly disperse them in the resins or coatings. If they are used in an proportion large enough to provide sufficient electrical conductivity, the dissociable inorganic salts are separated from the packages or containers themselves or from the electrically-conducting coatings, and the thus-separated inorganic salts likewise damage the electronic parts.

Lithium perchlorate, one of the above-described dissociable inorganic salts, is known to be dissolved to a certain proportion in a resin containing ether bonds, for example, polyethylene oxide or polypropylene oxide or in a polyurethane resin formed of polyethylene oxide diol or polypropylene oxide diol as a constituent such that they form a solid solution. However, the solubility of lithium perchlorate is low, so that the use of lithium perchlorate in a proportion large enough to provide sufficient electrical conductivity develops a similar problem as mentioned above, such as damage to electronic parts. An increase in the molecular weight of polyethylene oxide or polypropylene oxide, in which lithium perchlorate is to be dissolved, makes it possible to provide lithium perchlorate with improved solubility. Such an increased molecular weight, however, leads to a reduction in the compatibility with the other resin or the solubility in a solvent upon preparation of a coating formulation, thereby failing to obtain a resin composition or coating formulation having sufficient practical utility.

To resolve such problems as described above, a technique is proposed in JP-A-2001-316593. Proposed is an electrically-conductive resin composition obtained by kneading an electrically-conductive polyurethane resin, which has been prepared by doping with a dissociable inorganic salt a polyurethane resin having polyalkylene oxide segments, with another thermoplastic resin. As the electrically-conductive resin contains hydrophilic polyoxyethylene segments in a large proportion, the electrically-conductive resin may not be able to exhibit sufficient compatibility depending on the kind of the thermoplastic resin. The electrically-conductive resin is, therefore, accompanied by a potential problem that a molding may not be obtained with uniform electrical conductivity on the surface thereof.

SUMMARY OF THE INVENTION

An object of the present invention is, therefore, to resolve the above-described problems of the conventional art and to provide an electrically-conductive resin composition equipped with sufficient antistatic performance so that, when the resin composition is molded into a package or container for electronic parts, no damage will be given to the electronic parts.

In one aspect of the present invention, there is thus provided an electrically-conductive resin composition comprising (A) a thermoplastic resin and (B) an electrically-conductive polymer blended together. The electrically-conductive polymer is an electrically-conductive polyester doped with a dissociable inorganic salt. The doped polyester is at least one polyester selected from the group consisting of (a) polyesters each of which has a weight average molecular weight of from 50,000 to 500,000 and has been obtained by subjecting at least caprolactone as a monomer to ring-opening polymerization and (b) comb polyesters each of which has one or more polyester chains each having a weight average molecular weight of from 50,000 to 200,000 and has been obtained by subjecting a lactone to ring-opening polymerization in the presence of a trifunctional or higher functional, polyhydric alcohol as a polymerization initiator.

In the present invention, a blending ratio (A):(B) of the thermoplastic resin (A) to the electrically-conductive polymer (B) can preferably be 50-95:50-5; the polyesters (a) can preferably consist of a homopolymer of caprolactone and copolymers of caprolactone with other lactones or lactides; the lactone can preferably be selected from the group consisting of propiolactone, butyrolactone, caprolactone, and alkyl derivatives thereof; the polyhydric alcohol can be selected preferably from the group consisting of glycerin, trimethylolpropane, hexanetriol, diglycerin, pentaerythritol, sorbitol, sucrose, partially-saponified polyvinyl alcohols, acrylic polyols, polybutadinepolyols, and ethylene oxide adducts thereof; the dissociable inorganic salt can preferably be an alkali metal salt, ammonium salt, alkaline earth metal salt or transition metal salt of at least one acid selected from the group consisting of isocyanic acid, perchloric acid, trifluoromethylsulfonic acid, halogenic acids and sulfonimides; and the thermoplastic resin can be selected preferably from the group consisting of polystyrene, polypropylene, polyesters, polyvinyl chloride, and polycarbonates.

In another aspect of the present invention, there is also provided an electrically-conductive resin molding obtained by molding the electrically-conductive resin composition according to the present invention. The molding can preferably have a surface resistance of from $10^6$ to $10^{10}$ $\Omega/\square$; and the molding can preferably be a packaging material for electronic parts.

According to the present invention, the specific polyester can be converted into an electrically-conductive polyester by doping it with a dissociable inorganic salt. When the electrically-conductive polyester is kneaded with a thermoplastic resin, an electrically-conductive resin composition of a sea (thermoplastic resin)-island (electrically-conductive polyester) structure which is uniform on the order of microns can be obtained irrespective of the kind of the thermoplastic resin. Even when molded into various shapes, the moldings have excellent electrical conductivity and are useful in various applications in which the prevention of electrification is required. Especially when employed as packaging materials for various electronic parts, the moldings have no potential problem of damaging them.

DETAILED DESCRIPTION OF THE INVENTION AND PREFERRED EMBODIMENTS

The present invention will next be described in further detail on the basis of preferred embodiments.

The resin composition according to the present invention is characterized in that the specific electrically-conductive polyester is added in the resin composition. The electrically-conductive polyester is one obtained by doping with the dissociable inorganic salt at least one polyester selected from the group consisting of (a) polyesters each of which has a weight average molecular weight of from 50,000 to 500,000 and has been obtained by subjecting at least caprolactone as a monomer to ring-opening polymerization and (b) comb polyesters each of which has a polyester chain having a weight average molecular weight of from 50,000 to 200,000 and has been obtained by subjecting a lactone to ring-opening polymerization in the presence of a trifunctional or higher functional, polyhydric alcohol as a polymerization initiator.

Polyesters (a)

As the caprolactone to be subjected to the ring-opening polymerization, ε-caprolactone is preferred. As other lactones which may be copolymerized with caprolactone, propiolactone, butyrolactone, lactides and the like can be mentioned. Each polyester (a) for use in the present invention can be either a homopolymer of caprolactone or a copolymer of caprolactone with another lactone or lactide. In the case of the copolymer, a copolymer containing 30 wt. % or more, preferably 70 wt. % or more of caprolactone units should be used desirably.

Each polyester (a) for use in the present invention can be obtained by subjecting the above-described lactone to ring-opening polymerization or copolymerization while using a polymerization initiator such as a monohydric or dihydric alcohol or an acid and a catalyst, although the polymerization initiator such as the alcohol may not be needed depending on the catalyst to be used. As the catalyst for use in the production of the polyester, a conventional, ring-opening addition polymerization catalyst can be used. Specific examples include inorganic bases, inorganic acids, organo (alkali metal) catalysts, tin compounds, titanium compounds, aluminum compounds, zinc compounds, molybdenum compounds, and zirconium compounds. Among these, the tin compounds and titanium compounds can be preferably used for their well-balanced handling ease, low toxicity, reactivity, non-discoloring property, stability and the like Specific examples of the tin compounds include stannous octylate; monobutyltin compounds such as monobutyltin oxide and monobutyltin tris(2-ethylhexanoate); and dibutyltin compounds such as dibutyltin oxide, diisobutyltin oxide, dibutyltin diacetate and di-n-butyltin dilaurate. Specific examples of the titanium compounds include tetramethyl titanate, tetraethyl titanate, tetra(n-propyl) titanate, tetraisopropyl titanate, and tetrabutyl titanate. These compounds can be used either singly or in combination.

Upon production of each polyester (a), the polymerization temperature can be in a range of from 50 to 250° C., preferably from 90 to 220° C., more preferably from 100 to 200° C. A polymerization temperature lower than 50° C. results in a low polymerization rate of lactone, while a polymerization temperature higher than 250° C. leads to the occurrence of a pyrolytic reaction of the resultant polyester so that the polyester is colored or decomposition products are formed. Polymerization temperatures outside the above range are not preferred accordingly. As a reactor for the polymerization of lactone, a known reactor can be used. Specific examples include a blade-agitated batch reactor, a semi-continuous or continuous reactor, a sigma kneader, a screw kneader such as an extruder, a static mixer reactor, and a reactor equipped with a plurality of such reactors continuously connected together.

Each polyester (a) obtained by the above-described polymerization can preferably have a weight average molecular weight of from 50,000 to 500,000. Such a molecular weight control can be readily conducted by changing the proportions of the polymerization initiator and lactone to be used or the proportions of the catalyst and lactone to be used. If the weight average molecular weight of the polyester is lower than 50,000, the doping rate is insufficient when doped with the dissociable inorganic salt. In addition, the polyester is in the form of a brittle wax, so that the eventually-available molding is insufficient in electrical conductivity and mechanical strength. If the weight average molecular weight of the polyester is higher than 500,000, on the other hand, the electrically-conductive polyester has insufficient uniform-kneadability with the other resin so that the eventually-available molding may be uneven in electrical conductivity.

Polyesters (b)

Each of the comb polyesters (b) is a polyester, which is obtained by subjecting a lactone to ring-opening polymerization in the presence of a trifunctional or higher functional, polyhydric alcohol as a polymerization initiator. No particular limitation is imposed on the polymerization initiator to be used here insofar as it has trifunctionality or higher functionality. Examples include glycerin, trimethylolpropane, hexanetriol, diglycerin, pentaerythritol, sorbitol, sucrose, partially saponified polyvinyl alcohols, acrylic polyols, polybutadinepolyols, and ethylene oxide adducts thereof.

Examples of the lactone which is subjected to ring-opening polymerization while using the above-described polyhydric alcohol include propiolactone, butyrolactone, caprolactone, and alkyl derivatives thereof, with ε-caprolactone being preferred. A polyhydric alcohol particularly suited for the ring-opening polymerization of ε-caprolactone is a pentafunctional or higher functional, polyhydric alcohol, specifically an ethylene oxide adduct of sorbitol or sucrose, said adduct having a hydroxyl number in a range of from 500 to 700. When the ring-opening polymerization of a lactone is conducted using a polyfunctional, especially a pentafunctional or higher functional, polyhydric alcohol, the resulting polyester takes the form of vegetable balls so that, when kneaded with the other thermoplastic resin, a resin composition of a sea-island structure which is uniform on the order of microns can be obtained.

The above-described polymerization of the lactone is conducted in the presence of a catalyst by ring-opening polymerization which makes use of the above-described polyhydric alcohol as an initiator, whereby the comb polyester (b) is obtained. The catalyst useful upon production of the polyester is the same as that mentioned in the production of the polyester (a). Further, conditions upon production of the comb polyester (b), such as the polymerization temperature, are also similar to the conditions mentioned in the production of the polyester (a).

Each comb polyester (b) obtained by the above-described polymerization has a weight average molecular weight of from 50,000 to 1,000,000 or so as a whole, and the weight average molecular weight of each polyester chain is required to be from 50,000 to 200,000. Such control of the molecular weight can be readily effected by changing the proportions of the polyhydric alcohol and lactone to be used. If the weight average molecular weight of each of the polyester chains is lower than 50,000, no sufficient doping rate can be achieved when doped with an dissociable inorganic salt, and moreover, the eventually-available molding is insufficient in electrical conductivity and mechanical strength because the polyester is in the form of a brittle wax. If the weight average molecular weight of each of the polyester chains is higher than 200,000, on the other hand, the electrically-conductive polyester may be insufficient in the uniform-kneadability with the other resin so that the eventually-available molding may be uneven in electrical conductivity. The term "the weight average molecular weight of each polyester chain" as used herein is a value available by dividing the weight average molecular weight of the polyester with the valence number of the polyhydric alcohol used.

In the present invention, the polyester (a) or (b) is doped with a dissociable inorganic salt. No particular limitation is imposed on the dissociable inorganic salt for use in the present invention insofar as it is an inorganic salt soluble in ester groups in the polyester (a) or (b) to form a solid solution. It can be an alkali metal salt, ammonium salt, alkaline earth metal salt or transition metal salt of at least one acid selected from the group consisting of isocyanic acid, perchloric acid, trifluoromethylsulfonic acid, halogenic acids and sulfonimides. Particularly preferred is lithium perchlorate.

The doping can be conducted either during or after the production of the polyester (a) or (b). As an alternative, it can also be conducted upon kneading the polyester (a) or (b) with the other resin to produce the resin composition. Whenever the doping is conducted, the dissociable inorganic salt is added to and mixed evenly in the molten resin such that the dissociable inorganic salt is dissolved in the polyester (a) or (b) to form a solid solution. The dissociable inorganic salt can be used preferably in a range of from about 0.5 to 10 parts by weight per 100 parts by weight of the polyester (a) or (b). If the dissociable inorganic salt is used in an unduly small proportion, the resulting electrically-conductive polyester may not be provided with sufficient electrical conductivity. If the dissociable inorganic salt is used in an excessively large proportion, on the other hand, the dissociable inorganic salt which has not been dissolved in the polyester (a) or (b) to form a solid solution exists in the polymer. This is not economical, and moreover, the undissolved dissociable inorganic salt may adversely affect mechanical or physical properties of the eventually-available molding, and subsequent to the molding, may be released from the molding to give damage to the packaged or contained products, for example, such as electronic parts.

The electrically-conductive resin composition according to the present invention can be obtained by kneading the above-described electrically-conductive polyester, which may be doped with the dissociable inorganic salt during this kneading, with the other thermoplastic resin. Usable examples of the other thermoplastic resin include thermoplastic resins known to date, such as polystyrene, polypropylene, polyesters and polyvinyl chloride. The blending ratio (A):(B) of the thermoplastic resin (A) to the electrically-conductive polymer (B) is 50-95:50-5 in general. The setting of such a blending ratio provides the eventually-available molding with a surface resistance of from $10^6$ to $10^{10}$ Ω/□ so that sufficient antistatic effects can be obtained. If the electrically-conductive polyester is used in an unduly small proportion, the eventually-available molding cannot be provided with sufficient electrical conductivity. If the electrically-conductive polyester is used in an excessively large proportion, on the other hand, this is not economical and moreover, the eventually-available molding is provided with reduced mechanical strength.

The electrically-conductive resin composition can be obtained by melt-kneading the electrically-conductive polyester and the thermoplastic resin, for example, in a known kneading machine such as an extruder, Banbury mixer, two-roll mill, three-roll mill or kneader. The resin composition according to the present invention may be in any form, but preferably, is formed into pellets. Upon conducting the above-described melt-kneading, various additives which are commonly used as additives for resins can be added at the same time obviously.

The electrically-conductive resin molding according to the present invention can be obtained by molding or otherwise forming the electrically-conductive resin composition according to the present invention in accordance with a desired molding or forming process, for example, such as extrusion, T-die extrusion, inflation (blow-film extrusion), injection molding, vacuum forming or blow molding. No particular limitation is imposed on the shape of the molding, and the molding can be, for example, in the form of a film, sheet or plate, a post-formed molding thereof, or the like. Preferably, it is in the form of a packaging material for electronic parts such as ICs, capacitors, transistors or LSIs. The molding obtained as described above is provided with a surface resistance of from $10^6$ to $10^{10}$ Ω/□ and hence, has sufficient antistatic properties.

EXAMPLES

The present invention will next be descried more specifically based on synthesis examples, examples and comparative examples, in which the designations of "part" or "parts" and "%" are on a weight basis unless otherwise specifically indicated.

Examples Using Polyesters (a)

Synthesis Example 1

Using ε-caprolactone, a polymerization initiator and a catalyst (dibutyltin oxide: used in a trace amount), polymerization was conducted at 200 to 220° C. for 2 hours while bubbling nitrogen gas. The weight average molecular weight of the resulting polyester was about 100,000.

Synthesis Example 2

Using ε-caprolactone (70 parts), a lactide (30 parts) and a catalyst (dibutyltin oxide: used in a trace amount), polymerization was conducted at 140° C. with bubbling of nitrogen gas until the weight average molecular weight reached 280,000.

Comparative Synthesis Example 1

Following the procedure described in U.S. Pat. No. 3,186,958, polyethylene oxide having a weight average molecular weight of 50,000 was synthesized.

Comparative Synthesis Example 2

Using adipic acid and 1,4-butanediol in predetermined proportions along with a catalyst (zinc acetate: used in a trace amount), polymerization was conducted at 170 to 200° C. under environmental pressure for 10 hours and then, at 200 to 230° C. under a reduced pressure not higher than 0.1 mmHg until the weight average molecular weight reached 200,000, whereby an aliphatic polyester was obtained.

Incidentally, the measurement of the weight average molecular weight in each of the above synthesis examples was conducted by GPC (polystyrene-converted).

Examples 1-4 & Comparative Examples 1-2

In each of the examples or comparative examples, the corresponding polyester obtained in the relevant synthesis example, the corresponding thermoplastic resin and the corresponding dissociable inorganic salt were mixed in the respective proportions shown in Table 1, kneaded at about 130 to 240° C. in an extruder, and then formed into a sheet of 0.5 mm thickness by T-die extrusion. The surface resistance of the sheet was measured at 25° C. and 45% relative humidity. The strength at break of the sheet in accordance with JIS K 6301, and in comparison with a comparative sheet formed in a similar manner as described above from the corresponding thermoplastic resin alone shown in Table 1, its percent strength retention was calculated. Each percent strength retention was calculated in accordance with the following formula: [the strength at break of the sheet in an example or comparative example]/[the strength at break of the comparative sheet]×100 (%), and was ranked "A" where the percent strength retention was 90% or greater or "B" where the percent strength retention was smaller than 90%.

TABLE 1

| | | Example | | | | Comp. Ex. | |
|---|---|---|---|---|---|---|---|
| Components | | 1 | 2 | 3 | 4 | 1 | 2 |
| Polyester (a) | Synthesis 1 | 20 | 20 | — | — | — | — |
| | Synthesis 2 | — | — | 20 | 20 | — | — |
| | Comparative Synthesis 1 | — | — | — | — | 20 | — |
| | Comparative Synthesis 2 | — | — | — | — | — | 20 |
| Thermoplastic resin | PS[1] | 80 | 80 | 80 | — | 80 | 80 |
| | A-PET[2] | — | — | — | 80 | — | — |
| Dissociable inorganic salt | Lithium perchlorate | 0.5 | 1.0 | 0.5 | — | 1.0 | 1.0 |
| | Magnesium chloride | — | — | — | 0.5 | — | — |
| Surface resistance, Ω/□ | | $10^9$ | $10^9$ | $10^9$ | $10^9$ | $10^{11}$ | $10^{11}$ |
| Percent strength retention | | A | A | A | A | B | A |

[1] PS: polystyrene resin,
[2] A-PET: amorphous polyethylene terephthalate

As evident from the results of Table 1, molded or otherwise formed products having excellent electrical conductivity and mechanical strength can be obtained from the electrically-conductive resin compositions of the present invention (Examples 1-4). In Comparative Example 1 which falls outside the scope of the present invention, on the other hand, the composition was not uniform and its formed product had a reduced strength. Further, the measurement value of the surface resistance of its formed product does not indicate the availability of any electrical conductivity effective for the prevention of electrification. Turning to the resin composition of Comparative Example 2, its formed product was good in strength but high in surface resistance. No effective antistatic properties were hence available from the resin composition of Comparative Example 2.

Examples Using Polyesters (b)

Synthesis Examples 5-8 & Comparative Synthesis Examples 3-4

In each of the synthesis examples or comparative synthesis examples, polymerization was conducted at 200 to 220° C. for 2 hours with bubbling of nitrogen gas by using ε-caprolactone, the corresponding polyhydric alcohol and a catalyst (dibutyltin oxide: used in a trace amount) in accordance with the corresponding formulation shown below in Table 2. The weight average molecular weight of the resulting polycaprolactone and the weight average molecular weight per side chain (the whole molecular weight/the valence number of the corresponding polyhydric alcohol) is shown in Table 3. The measurement of the above molecular weight was conducted by GPC (polystyrene-converted).

TABLE 2

| | Lactone | Polyhydric alcohol |
|---|---|---|
| Synth. Ex. 5 | ε-Caprolactone 100 parts | "SP-600" 0.093 part |
| Synth. Ex. 6 | ε-Caprolactone 100 parts | "SC-800" 0.1 part |

TABLE 2-continued

|  | Lactone | Polyhydric alcohol |
|---|---|---|
| Synth. Ex. 7 | ε-Caprolactone 100 parts | Diglycerin 0.0415 part |
| Synth. Ex. 8 | ε-Caprolactone 100 parts | "T-4000" 1.33 parts |
| Comparative Synth. Ex. 3 | ε-Caprolactone 100 parts | "SP-600" 0.372 part |
| Comparative Synth. Ex. 4 | ε-Caprolactone 100 parts | "SC-800" 0.033 part |

"SP-600": product of ASAHI DENKA CO., Ltd., sorbitol-ethylene oxide adduct, hydroxyl number: 530-570, viscosity: 2,900-4,100 cps (25° C.).
"SC-800": product of ASAHI DENKA CO., Ltd., sucrose-ethylene oxide adduct, hydroxyl number: 535-565, viscosity: 13,000-20,000 cps (25° C.).
"T-4000": product of ASAHI DENKA CO., Ltd., trimethylolpropane-ethylene oxide adduct, hydroxyl number: 39-45, viscosity: 600-800 cps (25° C.).

TABLE 3

|  | Whole weight average molecular weight | Weight average molecular weight per side chain |
|---|---|---|
| Synth. Ex. 5 | Approx. 600,000 | Approx. 100,000 |
| Synth. Ex. 6 | Approx. 800,000 | Approx. 100,000 |
| Synth. Ex. 7 | Approx. 400,000 | Approx. 100,000 |
| Synth. Ex. 8 | Approx. 300,000 | Approx. 100,000 |
| Comparative Synth. Ex. 3 | Approx. 150,000 | Approx. 25,000 |
| Comparative Synth. Ex. 4 | Approx. 8 × 300,000 | Approx. 300,000 |

Examples 5-11 & Comparative Examples 3-4

In each of the examples or comparative examples, the corresponding comb polyester obtained in the relevant synthesis example or comparative synthesis example, the corresponding thermoplastic resin and the corresponding dissociable inorganic salt were mixed in the corresponding proportions shown in Table 4, and were then formed into a sheet as in Example 1. The surface resistance of the sheet and its strength at break were measured as in Example 1. Compared with a comparative sheet likewise prepared from the corresponding thermoplastic resin alone shown in Table 4, the percent strength retention of the sheet was also calculated similarly.

As evident from the results of Table 4, molded or otherwise formed products having excellent electrical conductivity and mechanical strength can be obtained from the resin compositions of the present invention (Examples 5-11). In Comparative Example 4 which falls outside the scope of the present invention, on the other hand, the composition did not become uniform, and the measurement value of the surface resistance does not indicate the availability of any electrical conductivity effective for the prevention of electrification. Further, the formed products made of the resin compositions of Comparative Examples 3 and 4, respectively, were both low in strength so that the resin compositions were not suited as molding or forming resin compositions.

This application claims the priority of Japanese Patent Application 2004-203860 filed Jul. 9, 2004, which is incorporated herein by reference.

The invention claimed is:

1. An electrically-conductive resin composition for molding consisting essentially of (A) a thermoplastic resin and (B) an electrically-conductive polymer blended together, wherein said electrically-conductive polymer is an electrically-conductive polyester doped with a dissociable inorganic salt, and said doped polyester is a comb polyester having one or more polyester chains each having a weight average molecular weight of from 50,000 to 200,000 and having been obtained by subjecting a lactone to ring-opening polymerization in the presence of a trifunctional or higher functional, polyhydric alcohol as a polymerization initiator, wherein said polyhydric alcohol is selected from the group consisting of glycerin, trimethylolpropane, hexanetriol, diglycerin, pentaerythritol, sorbitol, sucrose, partially-saponified polyvinyl alcohols, acrylic polyols, polybutadinepolyols, and ethylene oxide adducts thereof.

2. An electrically-conductive resin composition according to claim 1, wherein a blending ratio (A):(B) of said thermoplastic resin (A) to said electrically-conductive polymer (B) is 50-95:50-5.

3. An electrically-conductive resin composition according to claim 1, wherein said lactone is selected from the group consisting of propiolactone, butyrolactone, caprolactone, and alkyl derivatives thereof.

4. An electrically-conductive resin composition according to claim 1, wherein said dissociable inorganic salt is an alkali metal salt, ammonium salt, alkaline earth metal salt or transition metal salt of at least one acid selected from the

TABLE 4

|  |  | Example | | | | | | | Comp. Ex. | |
|---|---|---|---|---|---|---|---|---|---|---|
| Components | | 5 | 6 | 7 | 8 | 9 | 10 | 11 | 3 | 4 |
| Polyester (b) | Synth. Ex. 5 | 20 | 20 | 5 | — | — | — | — | — | — |
|  | Synth. Ex. 6 | — | — | — | 20 | — | 20 | — | — | — |
|  | Synth. Ex. 7 | — | — | — | — | 20 | — | — | — | — |
|  | Synth. Ex. 8 | — | — | — | — | — | — | 20 | — | — |
|  | Comp. Synth. Ex. 3 | — | — | — | — | — | — | — | 20 | — |
|  | Comp. Synth. Ex. 4 | — | — | — | — | — | — | — | — | 20 |
| Thermoplastic resin | PS[1] | 80 | 80 | 95 | 80 | 80 | — | — | 80 | 80 |
|  | A-PET[2] | — | — | — | — | — | 80 | — | — | — |
|  | PETG[3] | — | — | — | — | — | — | 80 | — | — |
| Dissociable inorganic salt | Lithium perchlorate | 0.5 | 1.0 | 1.5 | 0.15 | 0.15 | — | 1.0 | 1.0 | 1.0 |
|  | Magnesium chloride | — | — | — | — | — | 0.5 | — | — | — |
| Surface resistance, Ω/□ | | $10^7$ | $10^7$ | $10^7$ | $10^8$ | $10^8$ | $10^8$ | $10^7$ | $10^7$ | $10^{11}$ |
| Percent strength retention | | A | A | A | A | A | A | A | B | B |

[1] PS: polystyrene resin,
[2] A-PET: amorphous polyethylene terephthalate,
[3] PETG: copolymerized polyethylene terephthalate.

group consisting of isocyanic acid, perchloric acid, trifluoromethylsulfonic acid, halogenic acids and sulfonimides.

5. An electrically-conductive resin composition according to claim 1, wherein said thermoplastic resin is selected from the group consisting of polystyrene, polypropylene, polyesters, polyvinyl chloride, and polycarbonates.

6. An electrically-conductive resin molding obtained by molding an electrically-conductive resin composition according to claim 1.

7. An electrically-conductive resin molding according to claim 6, wherein said molding has a surface resistance of from $10^6$ to $10^{10}$ $\Omega/\square$.

8. An electrically-conductive resin molding according to claim 6, wherein said molding is a packaging material for electronic parts.

* * * * *